(12) United States Patent
Fujii

(10) Patent No.: US 8,076,725 B2
(45) Date of Patent: Dec. 13, 2011

(54) SEMICONDUCTOR DEVICE AND METHOD FOR MANUFACTURING THE SAME

(75) Inventor: Hiroki Fujii, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 626 days.

(21) Appl. No.: 12/153,252

(22) Filed: May 15, 2008

(65) Prior Publication Data

US 2008/0283914 A1  Nov. 20, 2008

(30) Foreign Application Priority Data

May 18, 2007 (JP) ................................. 2007/133361

(51) Int. Cl.
   *H01L 29/66* (2006.01)
(52) U.S. Cl. . 257/335; 257/328; 257/334; 257/E21.417; 257/E21.418; 257/E29.257; 438/218; 438/224; 438/268; 438/358
(58) Field of Classification Search .......... 257/E21.418, 257/E21.447, E21.537, E27.057, 60, 136, 257/263–267, 302, 328–334, 335, 349; 438/192, 438/193, 206, 209, 218, 222, 224, 262, 268, 438/358, 370, 526, 527, FOR. 160
See application file for complete search history.

(56) References Cited

U.S. PATENT DOCUMENTS

| 4,589,004 | A | * | 5/1986 | Yasuda et al. ................. 257/337 |
| 5,132,235 | A | * | 7/1992 | Williams et al. .............. 438/294 |
| 2004/0248389 | A1 | * | 12/2004 | Iwabuchi ..................... 438/510 |

FOREIGN PATENT DOCUMENTS

| JP | 2003-303964 | 10/2003 |
| JP | 2003-347546 | 12/2003 |

* cited by examiner

*Primary Examiner* — Lynne Gurley
*Assistant Examiner* — Meiya Li
(74) *Attorney, Agent, or Firm* — McGinn IP Law Group, PLLC

(57) ABSTRACT

An impurity buried layer constructed by two buried regions formed by impurities of identical type exist, a buried region formed by an impurity having a slow diffusion speed is provided on the entire surface of a transistor formation region, and a buried region formed by an impurity having a fast diffusion speed is provided inwardly from beneath the inside end of an isolation insulating film serving as a region on which an electric field concentrates partially.

13 Claims, 10 Drawing Sheets

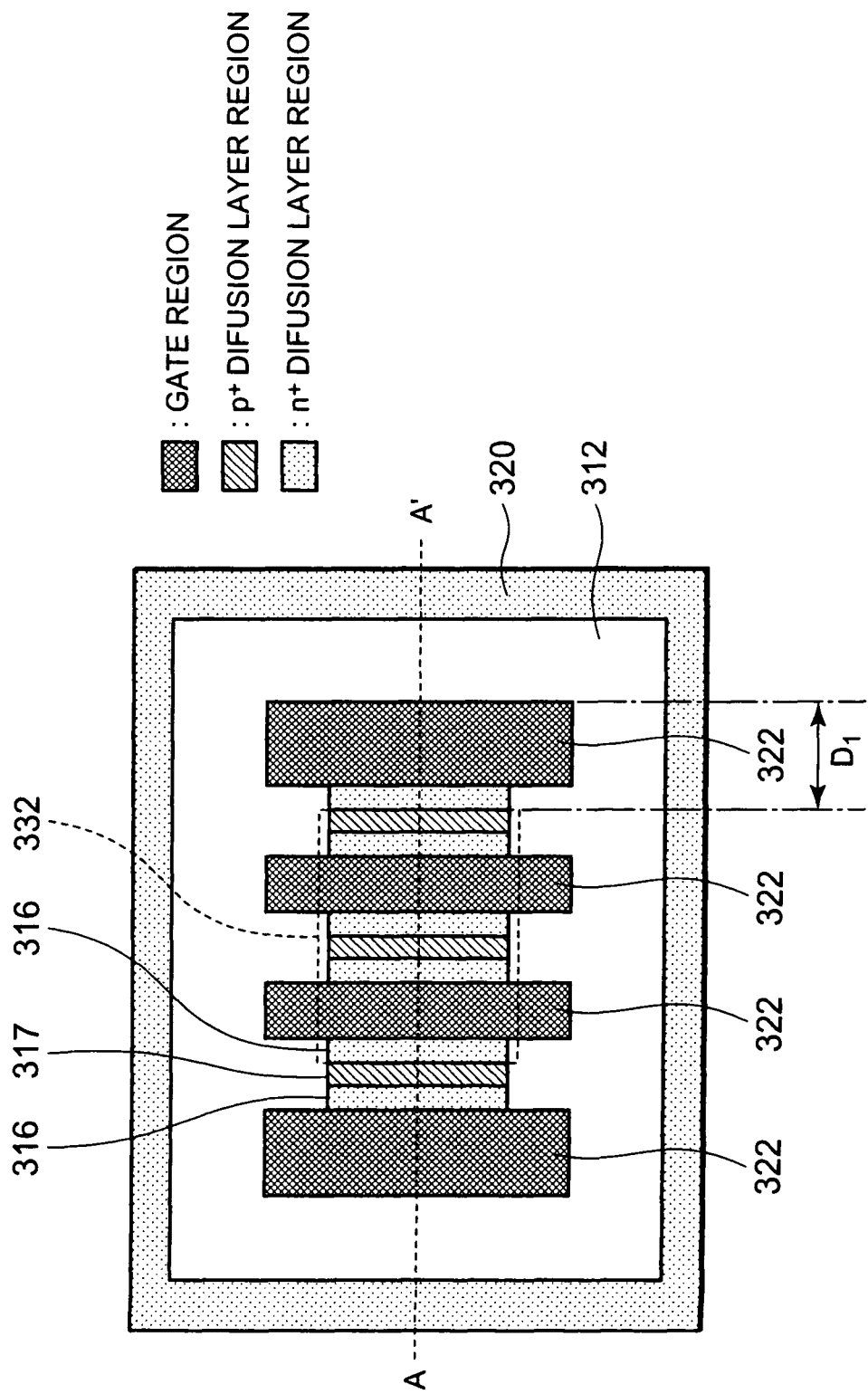

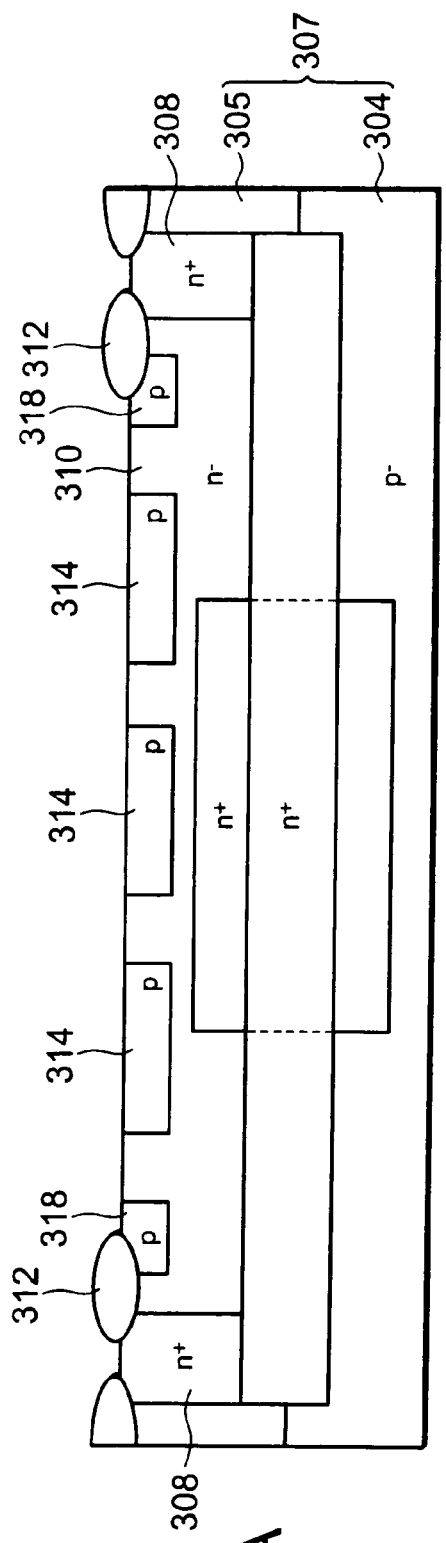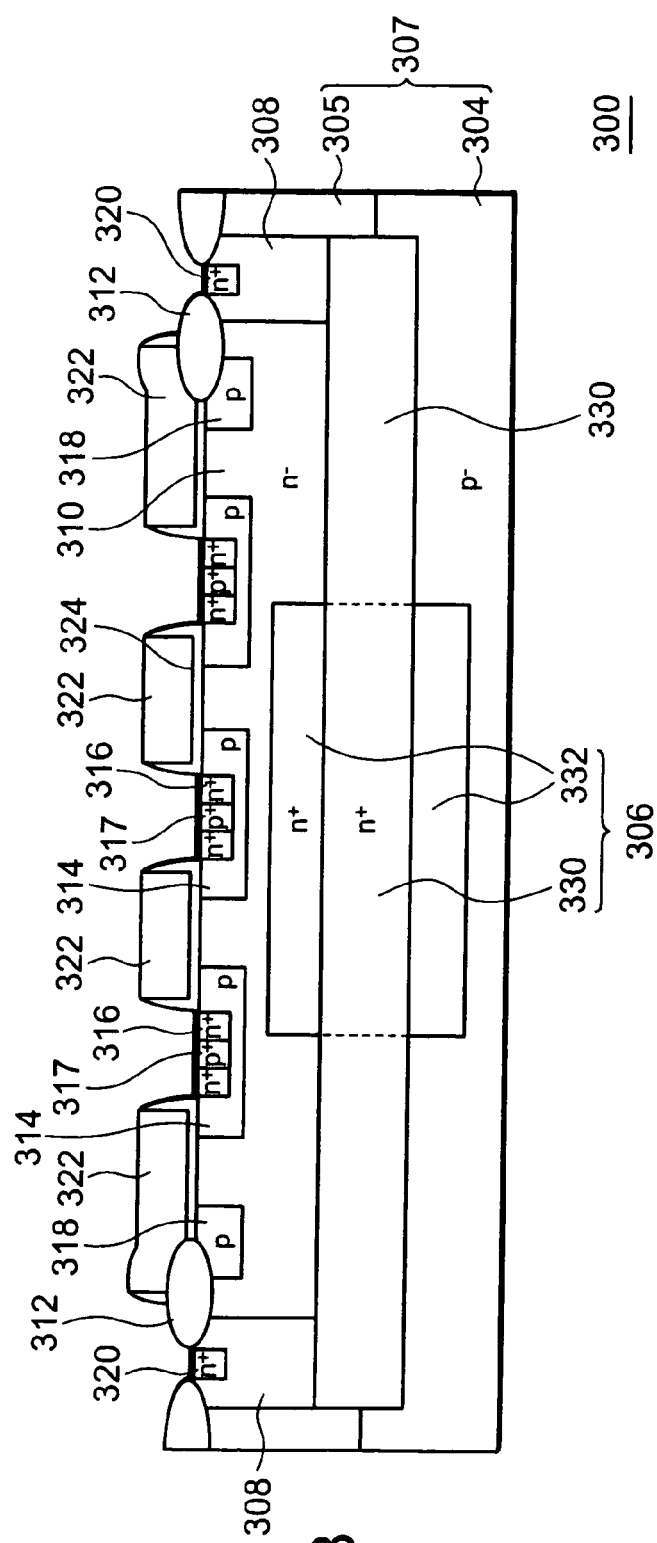
FIG. 5A
FIG. 5B

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same.

2. Description of the Related Art

In recent years, an attempt to apply high breakdown voltage MOS transistors to on-vehicle applications has been made. In these applications, to achieve low-consumption power, not only lowering ON resistance while maintaining the high OFF breakdown voltage of 100 V class but also high resistivity to ESD surge is required.

FIG. 8 shows the structure of a traditional VDMOS (Vertical Double-diffused MOS) semiconductor device, which is a high breakdown voltage MOS transistor.

A semiconductor device 200 (VDMOS) includes a p-type semiconductor substrate 204, $n^+$ impurity buried layer 206, $n^-$ drift regions 210, isolation insulating films 212, p body regions 214 and p well regions 218 formed in the drift regions 210, $n^+$ source regions 216 formed in the p body regions 214, $n^+$ drain extracting regions 220 formed in the sinkers 208, gate insulating films 224, and gate electrodes 222.

The drift regions 210 are constructed to have a low impurity concentration to acquire high breakdown voltage of the semiconductor device 200. On the other hand, the impurity buried layer 206, the sinkers 208, and the drain extracting regions 220 are constructed to have higher impurity concentrations than the drift regions 210 to lower ON resistance. The sinkers 208 and the drain extracting regions 220 function as drain regions. In this construction, as shown by the arrows in the drawing, a current between the source regions 216 and the drain extracting regions 220 flows via the impurity buried layers 206 and the sinkers 208.

The properties of a transistor thus constructed are generally by a breakdown voltage and ON resistance. The higher a breakdown voltage, and the lower an ON resistance, the properties are better. However, the both are in the relationship of tradeoff; usually, if the property of one is increased, the property of the other decreases.

In JP-A No. 303964/2003, technology intended to maintain breakdown voltage while lowering ON resistance is described. As shown in FIG. 9, according to JP-A No. 303964/2003, first and second epitaxial layers (23 and 24) are formed on the surface of a substrate 22, a dense first buried layer 31 is formed between the substrate 22 and the first epitaxial layer 23, and a less dense second buried layer 33 than the first buried layer 31 is formed between the first epitaxial layer 23 and the second epitaxial layer 24.

As described in JP-A No. 347546/2003, as shown in FIG. 10, a well region is formed to enclose the body regions 126 (corresponding to the body regions 214 of FIG. 8) and not contain the curbed portions 160 of the body regions of the outermost corner on which electric field concentrates. This intends to decrease ON resistance while maintaining breakdown voltage.

The present inventor has recognized as follows. As shown in FIG. 8, the partial concentration of an electric field is prone to occur in the inside end (gate bird's peak portion: A enclosed by the dashed line in the drawing) of the isolation insulating film 212 being a gate-drain separation oxide film. Therefore, breakdown is prone to occur in the location. When breakdown thus occurs in the substrate surface, ESD resistivity decreases and hot carrier characteristics decrease.

With the construction described in JP-A No. 303964/2003, as shown in FIG. 9, since the second buried layer 33 is formed to elongate to beneath the LOCOS edge, an electric field is prone to occur in the location, breakdown is prone to occur on the substrate surface. Still, this problem is not solved. Therefore, there is a problem in that resistivity to ESD surge cannot be acquired. As shown in the FIG. 9, the second buried layer 33 having a higher impurity concentration than the second epitaxial layer 24 contacts diffusion regions 36, 37, and 38 (corresponding to the body regions in FIG. 8). Therefore, increasing the impurity concentration of the second buried layer 33 to lower ON resistance decreases breakdown voltage and makes it impossible to significantly decrease ON resistance.

In the construction described in JP-A No. 347546/2003, as shown in FIG. 10, a well 110 having a higher impurity concentration than a drift region 106 contacts body regions (the body regions 214 of FIG. 8). Therefore, increasing of impurity concentration to decrease ON resistance decreases breakdown voltage, disabling a significant decrease in ON resistance. Furthermore, as shown in FIG. 10, the well 110 is not formed in connection with a buried layer 104, and a drift region 106 intervenes between them. Therefore, there is a problem in that the effect of decreasing ON resistance is low. Such a construction makes it impossible to acquire breakdown voltage of 100V class required in, for example, on-vehicle applications.

SUMMARY

According to one aspect of the present invention, there is provided a method for manufacturing a semiconductor device including a VDMOS transistor including: a semiconductor layer at a the surface of which a drift region of the second conductivity type, plural body regions of first conductivity type each including a source region of second conductivity type that are formed in the drift region, and a drain extracting region of the second conductivity type that encloses the outer circumference of the drift region and has a higher impurity concentration than the drift region are formed; and a separation insulating layer that is provided to enclose the outer circumference of the drift region on the semiconductor layer and separates the drift region from the drain extracting region, the method including: preparing a semiconductor substrate and injecting a first impurity of the second conductivity type to a first region being the entire region in which the drift region and the drain extracting region on the semiconductor substrate are formed; injecting a second impurity that is an impurity of the second conductivity type and has a faster diffusion speed than the first impurity to a second region that is inside and narrower than the first region being an internal region a specific width further inwardly away from the inside end of the separation insulating film of the semiconductor substrate; and forming an epitaxial layer on the semiconductor substrate and forming the semiconductor layer constituted by the semiconductor substrate and the epitaxial layer, and at the same time, diffusing the first and the second impurities injected in the first impurity injection process and the second impurity injection process to form a buried layer of the second conductivity type that has a higher impurity concentration than the drift region so as to include the drift region between the buried layer and the body region, wherein the buried layer of the second conductivity type constitutes a drain region.

According to another aspect of the present invention, there is provided a semiconductor device that includes a VDMOS transistor including: a semiconductor layer; a drift region formed at the surface of the semiconductor layer; plural body regions each including a source region of second conductivity type that are formed in the drift region; a drain extracting region of second conductivity type that encloses the outer circumference of the drift region and has a higher impurity concentration than the drift region; a separation insulating film, on the semiconductor layer, that is provided to enclose the outer circumference of the drift region and separates the drift region from the drain extracting region; a gate electrode, on the semiconductor layer, that is formed over the body region and constitutes an opening over the source region; and a buried layer of the second conductivity type, in the semiconductor layer, that is formed below the entire region of the drift region and the drain extracting region and has a higher impurity concentration than the drift region, the buried layer constituting a drain region, wherein the buried layer includes a first buried region includes a first buried region formed below the entire region of the drift region and the drain extracting region, and a second buried region that is selectively disposed in a region a specific width further inwardly away from the inside end of the separation insulating layer and is formed continuously to the first buried layer over the first buried region, and the drift region intervenes between the buried region and the body regions across the entire surface.

By the above-described method for manufacturing the semiconductor device, the semiconductor device including the first buried region and the second buried region as described above can be obtained. According to the semiconductor device of the present invention, the second buried region is not provided beneath the isolation insulating film being the gate-drain separation oxide film on which an electric field is prone to concentrate, and in the region, the buried layer is provided only in a position deep from the surface of the semiconductor layer. By providing a buried region having a higher impurity concentration than the drift region, breakdown voltage drops in the location. As in the construction of the present invention, by providing a buried layer selectively in the inside region in a position shallow from the surface of the semiconductor layer, breakdown voltage in that portion can be made lower than that of a region beneath the isolation insulating film. Thereby, the concentration of an electric field beneath the isolation insulating film can be prevented. As a result, breakdown can be prevented from occurring on the surface of the semiconductor layer, and as described later, since breakdown can be caused in a wide range in a considerably deep position from the surface of the semiconductor layer, ESD resistivity and hot carrier properties can be improved.

Since the buried layer of the inside region serving as a principal current path is formed in a shallow position, ON resistance can be effectively decreased. Furthermore, since the drift region having a low impurity concentration intervenes between the body region and the buried region, OFF resistivity can be kept high. Thereby, while keeping high resistivity of 100V class, ON resistance can be decreased and, at the same time, high resistivity to ESD surge can be acquired.

With the technology described in JP-A No. 303964/2003, since epitaxial growth is performed plural times to form the second buried layer 33, manufacturing costs increase. However, according to the method for manufacturing a semiconductor device of the present invention, since buried layers are formed using impurities having different diffusion speeds, without the need to perform epitaxial growth plural times, the manufacturing procedure can be simplified and costs can be reduced. The order of the first impurity injection process and the second impurity injection process is not limited; which of them may be performed earlier.

According to the present invention, a semiconductor device is provided in which a buried layer formed by two buried regions of identical type that have different diffusion speeds exists, a buried region formed by an impurity having a slow diffusion speed is provided in the entire surface of a transistor formation region, and a buried region formed by an impurity a fast diffusion speed is provided inside the gate-drain separation oxide film region serving as a region on which an electric field concentrates partially. By thus forming a buried region in a shallow position from the surface of the semiconductor layer only in the inside by using an impurity having a fast diffusion speed to avoid the peripheral portion in which an electric field concentrates partially, breakdown can be caused in an inside buried region by suppressing the partial concentration of an electric field in the gate-drain separation oxide film region. As a result, a MOS transistor resistive to ESD surge that has low ON resistance while maintaining high breakdown voltage can be formed.

According to the present invention, with OFF breakdown voltage kept high, ON resistance can be decreased, and at the same time, resistivity to ESD surge can be increased.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 is a top view showing the construction of a semiconductor device in an embodiment of the present invention;

FIGS. 5A and 5B are process sectional views showing the procedure for manufacturing a semiconductor device in an embodiment of the present invention;

DETAILED DESCRIPTION OF THE PREFERRED EMBODIMENTS

Figure 1:
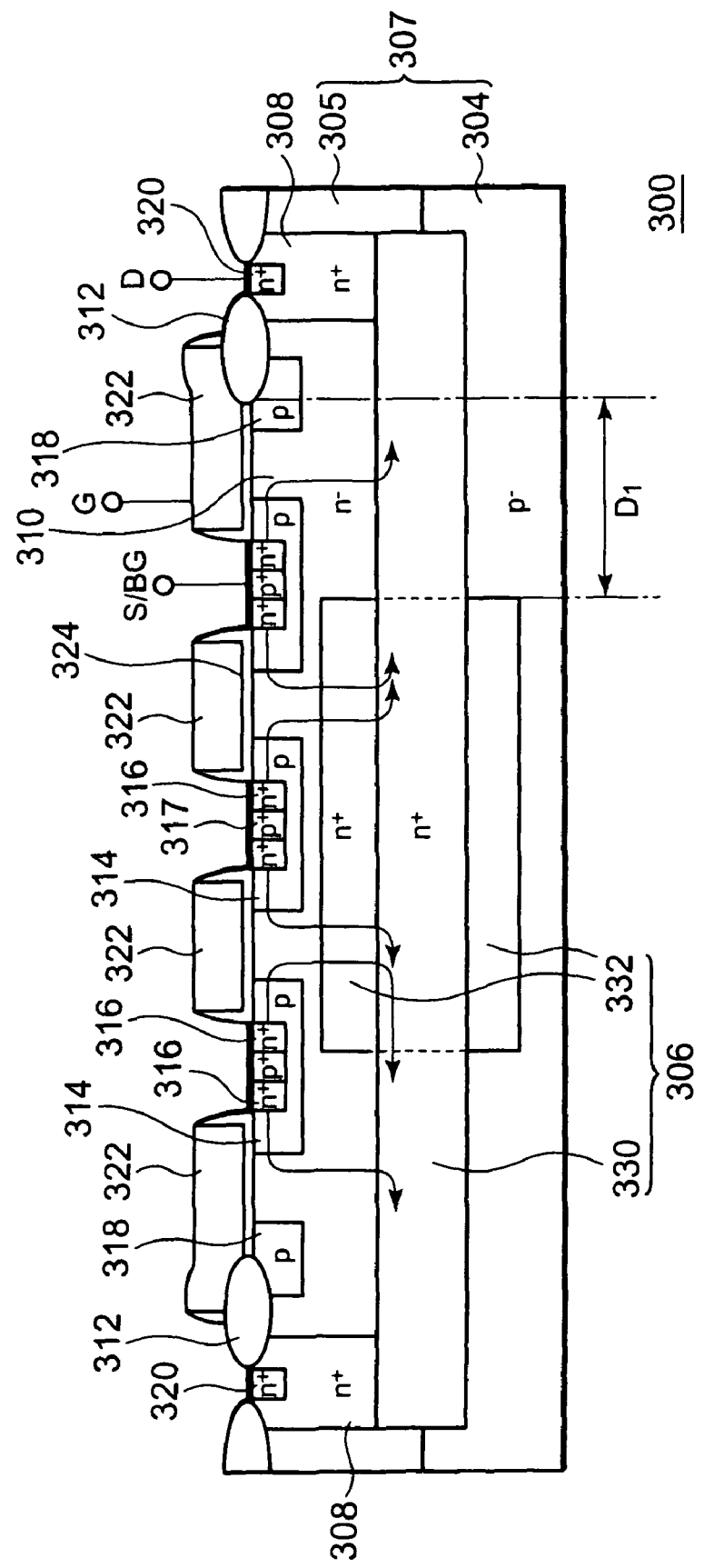
FIG. 1 is a sectional view showing the construction of a semiconductor device in an embodiment of the present invention.

Hereinafter, preferred embodiments of the present invention will be described with reference to the accompanying drawings. In all drawings, same components are identified by same reference numerals to omit duplicate descriptions.

In this embodiment, a semiconductor device is a VDMOS (Vertical Double-diffused MOS), which is a high breakdown voltage MOS transistor. In embodiments below, descriptions assume that a first conductivity type is P type and a second conductivity type is N type.

FIGS. 1 and 2 are drawing showing the construction of the semiconductor device in this embodiment. FIG. 2 is a top view of a semiconductor device 300 (VDMOS transistor), and FIG. 1 is a sectional view of FIG. 2 along the line A-A'.

The semiconductor device 300 includes a semiconductor substrate 304 of a first conductivity type (p) and a semiconductor layer 307 constituted by an epitaxial layer 305 of a second conductivity type (n$^-$) formed over the semiconductor substrate 304. The semiconductor device 300 further includes plural body regions 314 of the first conductivity type (p) each including a source region 316 of the second conductivity type (n$^+$) formed on the surfaces of the semiconductor layer 307, a drift region 310 of the second conductivity type (n$^-$) formed in the circumference of the plural body regions 314 on the surface of the semiconductor layer 307, sinkers (second drain extracting regions) 308 and drain extracting regions 320 of the second conductivity type (n$^+$), on the surface of the semiconductor layer 307, that surround the outer circumference of the drift region 310 and have higher impurity concentration than the drift region 310, and isolation insulating films 312 (separation insulating films), provided to enclose the outer circumference of the drift region 310 on the semiconductor layer 307, that separate the drift region 310 from the drain extracting regions 320.

The semiconductor device 300 further includes well regions 318 of the second conductivity type (p) provided in the lower part of the inside end of the isolation insulating films 312 on the surface of the semiconductor layer 307, isolation regions 317 of the first conductivity type (p$^+$) provided in the body regions 314 to separate the source regions 316, and gate electrodes 322 part of which is formed on the isolation insulating films 312 and which are formed on the body regions 314 via a gate insulating film 324 and constitute an opening on the source regions 316. In this embodiment, the source regions 316 and the body regions 314 are provided in connection with each other. The shorting of the source regions 316 and the body regions 314 prevents the operation of parasitic bipolar.

The semiconductor device 300 further includes an impurity buried layer 306 of the second conductivity type (n$^+$) that is formed between the semiconductor substrate 304 and the epitaxial layer 305 and has a higher impurity concentration than the drift region 310. The impurity buried layer 306 includes a first impurity buried region 330 and second impurity buried regions 332. The impurity buried layer 306 constitutes a drain region. The first impurity buried region 330 is formed on the whole surface of the lower part of the drift region 310 and the sinkers 308, and provided in connection with the sinkers 308. The second impurity buried regions 332 are provided continuously with the first impurity buried region above and below the first impurity buried region 330 in an internal region a specific width D1 further innerly away from the inside end of the isolation insulating films 312. The impurity buried layer 306 is formed without contact with the body regions 314 over the whole surface so that the drift region 310 intervene between the impurity buried layer 306 and the body region 314.

In the embodiment, the second impurity buried regions 332 are constructed to have a higher impurity concentration than the drift region 310 and a lower impurity concentration than the first impurity buried region 330. By making the impurity concentration of the second impurity buried regions 332 near to the P-type body regions 314 lower than that of the first impurity buried region 330, a decrease in breakdown voltage can be suppressed. In this embodiment, by making the breakdown voltage of the region in which the second impurity buried regions 332 lower than that of a lower region of the inside end of the isolation insulating films 312, the occurrence of breakdown in the vicinity of the isolation insulating films 312 is suppressed. It is desirable that the impurity concentration of the second impurity buried regions 332 is set to serve such a purpose, and the breakdown voltage of the semiconductor device 300 is set to a desired value as required.

The first impurity buried region 330 and the second impurity buried region 332 can respectively contain a first impurity and a second impurity different from the first impurity as principal components of impurities of the second conductivity type. The second impurity may have a faster diffusion speed than the first impurity. Among diffusion speeds of Sb (antimony), As (arsenic), and P (phosphorus) that are N-type impurities, a relation P>As>Sb is established. Possible combinations of the first and second impurities may be AS and P, Sb and P, or Sb and As in that order.

The drift region 310 is constituted to have low impurity concentration to ensure high breakdown voltage of the semiconductor device 300. On the other hand, the impurity buried layer 306, the sinkers 308, and the drain extracting regions 320 are constructed to have a higher impurity concentration than the drift region 310 to decrease ON-resistance. As shown by the arrows in the drawing, a current between the source regions 316 and the drain extracting regions 320 flows via the impurity buried layer 306 and the sinkers 308. In this embodiment, since the second impurity buried regions 332 are contained in the impurity buried layer 306, ON-resistance can be made lower. Although four gate electrodes 332, three sources 316, and two drains 320 are shown in FIG. 1, four gate electrodes 332, three sources 316, and two drains 320 are connected in common with each other respectively to function as one transistor as a whole.

The following describes the procedure for manufacturing the semiconductor device 300 in this embodiment. FIGS. 3 to 5 are process sectional views showing the procedure for manufacturing the semiconductor in this embodiment. An example below assumes that a first impurity is As and a second impurity is P.

Figure 3A:
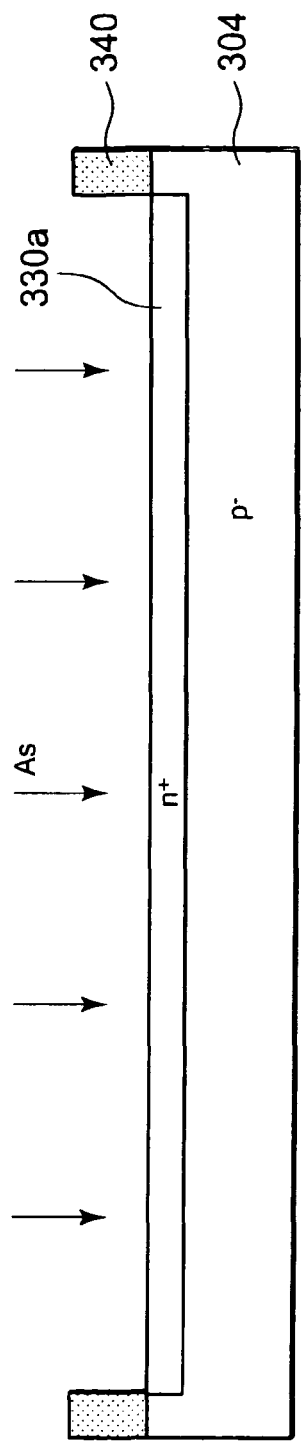
FIGS. 3A and 3B are process sectional views showing the procedure for manufacturing a semiconductor device in an embodiment of the present invention.

On the semiconductor substrate 304 of P-type, a first protection film 340 is formed by opening a first region, with the first protection film 340 as a mask, As is injected into the semiconductor substrate 304 to form a first impurity injection region 330a (FIG. 3A). The first region may be the whole surface of the drift region 310 and the regions in which the sinkers 308 are formed. A condition of injecting As may be, for example, 50 to 100 keV and $5 \times 10^{-13}$ to $5 \times 10^{-15}$ (5e13 to 5e15) cm$^{-2}$. The first protection film 340 may be, for example, a silicon oxide film.

Figure 3B:
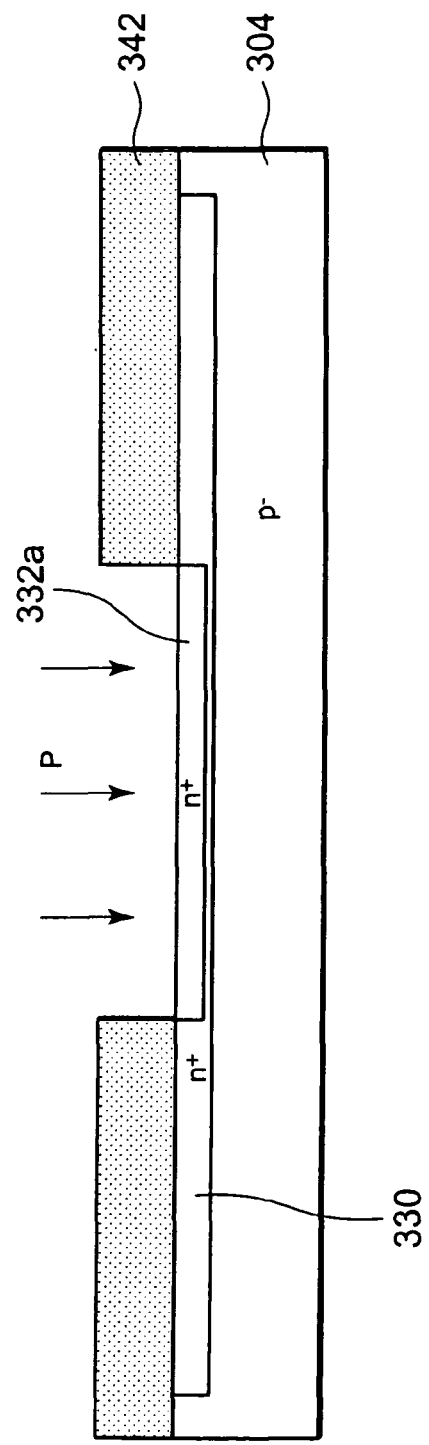

Next, on the semiconductor substrate 304, a second protection film 342 is formed by opening a second region that is inside and narrower than the first region, and with a second protection film 342 as a mask, P having a faster diffusion speed than As is injected into the semiconductor substrate 304 to form a second impurity injection region 332a (FIG. 3B). The second region may be an internal region a specific width D2 (D2>D1) further innerly away from the inside end of the isolation insulating films 312 formed later. The specific width D2 can be decided so that the specific value D1 shown in FIG. 1 is several micrometers when impurities are later diffused laterally. A condition of injecting P may be, for example, 50 to 100 keV, $5 \times 1013$ to $5 \times 1015$ (5e13 to 5e15) cm$^{-2}$. After this, the second protection film 342 is removed.

The second protection film 342 may be, for example, a silicon oxide film. In this case, after As is injected in the process shown in FIG. 3A, the first protection film 340 is removed, a silicon oxide film is formed again on the semiconductor substrate 304, and the second protection film 342 can be formed by patterning it. Alternatively, after As is injected, a resist film is formed on the first protection film 340, and the second protection film 342 may be formed by patterning the resist film. Furthermore, in the above-described method, although P is injected after the process of injecting As, the process may be reversed. That is, with the second protection film 342 constituted by, for example, a silicon film formed on the semiconductor substrate 304, after injecting P, by forming a resist film of a specific pattern on the second protection film 342, and with the resist film as a mask, selectively removing the second protection film 342, the first protection film 340 may be formed.

Figure 4A:
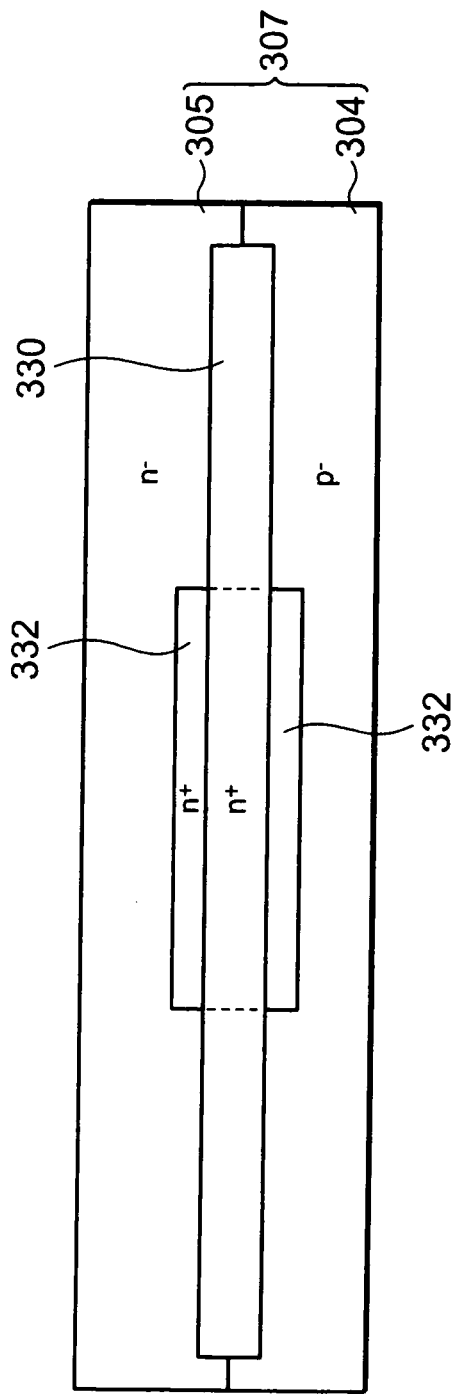
FIGS. 4A and 4B are process sectional views showing the procedure for manufacturing a semiconductor device in an embodiment of the present invention.

Next, heat of about 1100° C. is applied to form an epitaxial layer 305 of the N-type on the semiconductor substrate 304 (e.g., film thickness 5 to 10 μm). The concentration of impurity ion of N type in the epitaxial layer 305 may be, for example, $1 \times 10^{15}$ to $1 \times 10^{16}$ (1e15 to 1e16) cm$^{-2}$. Thereby, the semiconductor layer 307 is formed (FIG. 4A).

By the heat applied at this time, along with the growth of the epitaxial layer 305, As in the first impurity injection region 330a and P in the second impurity injection region 332a each are diffused. Since P is diffused faster than As, the second impurity buried region 332 constituted with P as a principal component of the impurities is formed wider in the laminating direction than the first impurity buried region 330 constituted with As as a principal component of the impurities. That is, the second impurity buried region 332 spreads above and below the first impurity buried region 330.

Figure 4B:
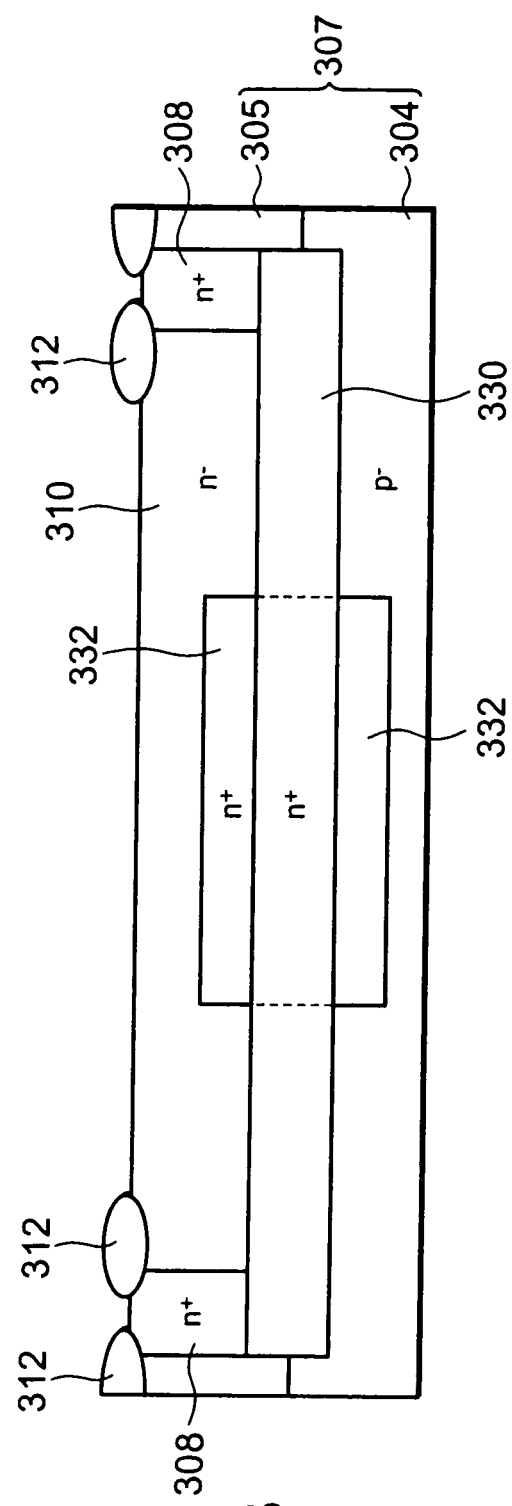

Next, the isolation insulating films 312 (LOCOS) is selectively formed on the surface of the semiconductor layer 307. Then, a mask of a specific pattern is used to form the sinkers 308 by injecting impurities of N type (FIG. 4B). The sinkers 308 can be formed by injecting P. A condition of injecting P may be the same as that at the above-described formation of the second impurity injection region 332a. Then, thermal processing exceeding 1000° C. is performed for about one to three hours to diffuse the impurities and connect the sinkers 308 with the first impurity buried region 330. By the above processing, the shape of the impurity buried layer 306 is almost decided.

Next, a mask of a specific pattern is used to form the body regions and the well regions 318 by injecting impurities of P type to the surface of the semiconductor layer 307 (FIG. 5A). As described above, the partial concentration of an electric field is prone to occur in the vicinity of the bird's beak in the inside end of the isolation insulating films 312. By forming the well regions 318 in the inside end of the isolation insulating films 312, the electric field in this portion can be damped.

Next, a mask of a specific pattern is used to form the source region 316 and the isolation region 317 in the body region 314. Then, after forming the gate insulating film 324 on the semiconductor layer 307, the gate electrode 322 is formed by forming a conductive layer serving as a gate electrode and performing patterning to a specific shape (FIG. 5B). Thereby, the semiconductor device 300 having the same construction as shown in FIG. 1 is obtained.

In this embodiment, as shown in FIG. 1, only the first impurity buried region 330 at a deep position exists directly below the inside end of the isolation insulating film 312 being the gate-drain separation oxide film in which the partial concentration of an electric field occurs. On the other hand, in the inside region, in addition to the first impurity buried region 330, a second impurity buried region 332 is formed at a shallow position on the first impurity buried region 330. Therefore, the breakdown voltage of the inside region can be made lower than that in a portion beneath the inside end of the isolation insulating film 312, so that the electric field can be prevented from concentrating partially beneath the inside end of the isolation insulating film 312. As a result, breakdown can be caused between the body region 314 and the second impurity buried region 332, that is, at a position far deep from the surface of the semiconductor layer 307, so that high resistivity to ESD surge can be obtained.

Furthermore, since the drift region 310 of the second conductivity type that has a low impurity concentration intervenes between the second impurity buried region 332 and the body region 314, OFF resistivity can be kept high. Furthermore, since the first impurity buried region 330, and the second impurity buried region 332 at a shallow position on the first impurity buried region 330 are formed in the inside region serving as a principal current path, the effect of increasing ON resistance can be increased. Therefore, with OFF resistivity kept high, ON resistance can be lowered to increase resistivity to ESD surge at the same time.

According to the procedure for manufacturing the semiconductor device 300 in this embodiment, since the first impurity buried region 330 and the second impurity buried region 332 are formed using the difference between the diffusion speeds of impurities having different diffusion speeds, the impurity buried layer 306 can be formed by a single epitaxial growth, so that the manufacturing procedure can be simplified and costs can be reduced.

Figure 6:
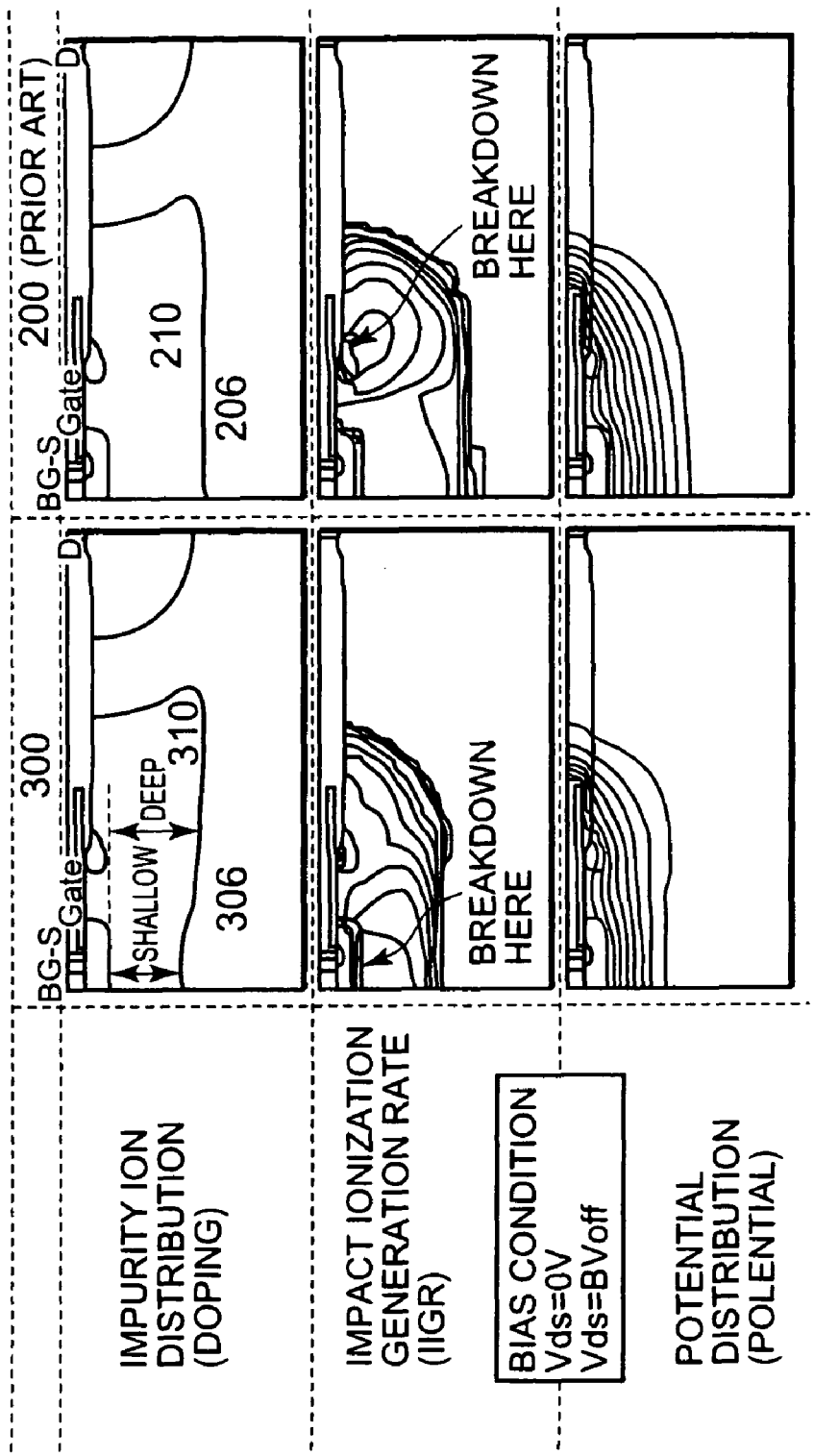
FIG. 6 is a drawing showing potential distributions in a semiconductor of this embodiment shown in FIG. 1 and a traditional semiconductor shown in FIG. 8.
Figure 7A:
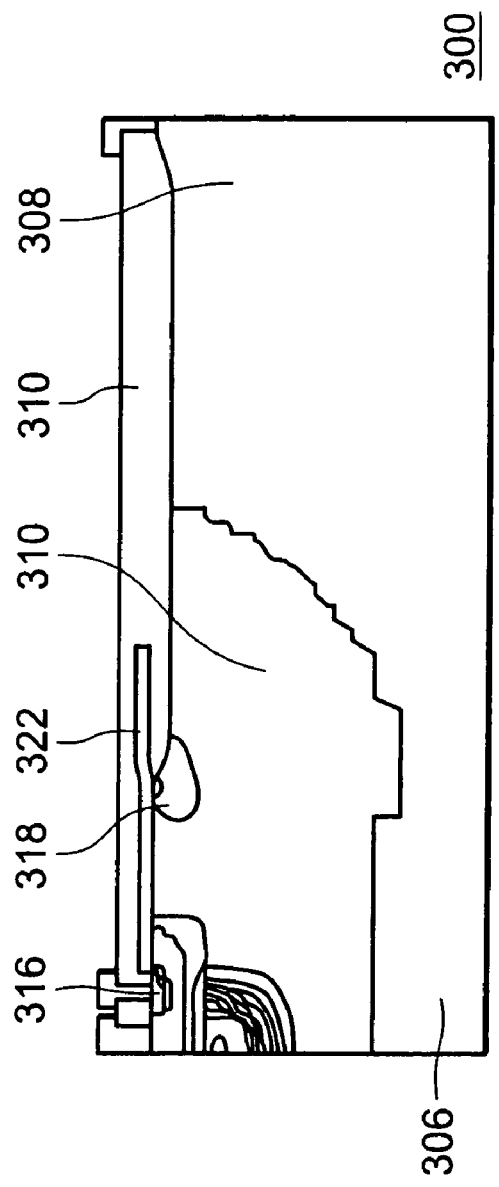
FIGS. 7A and 7B are drawings showing in detail the distribution of impact ionization generation rates shown in FIG. 6.
Figure 7B:
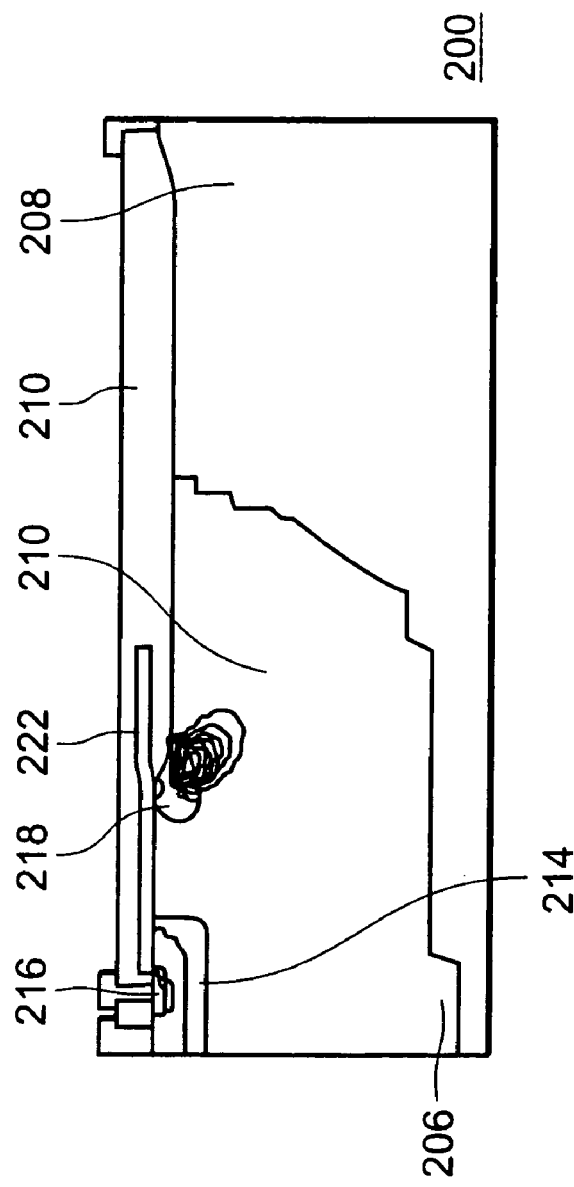
Figure 8:
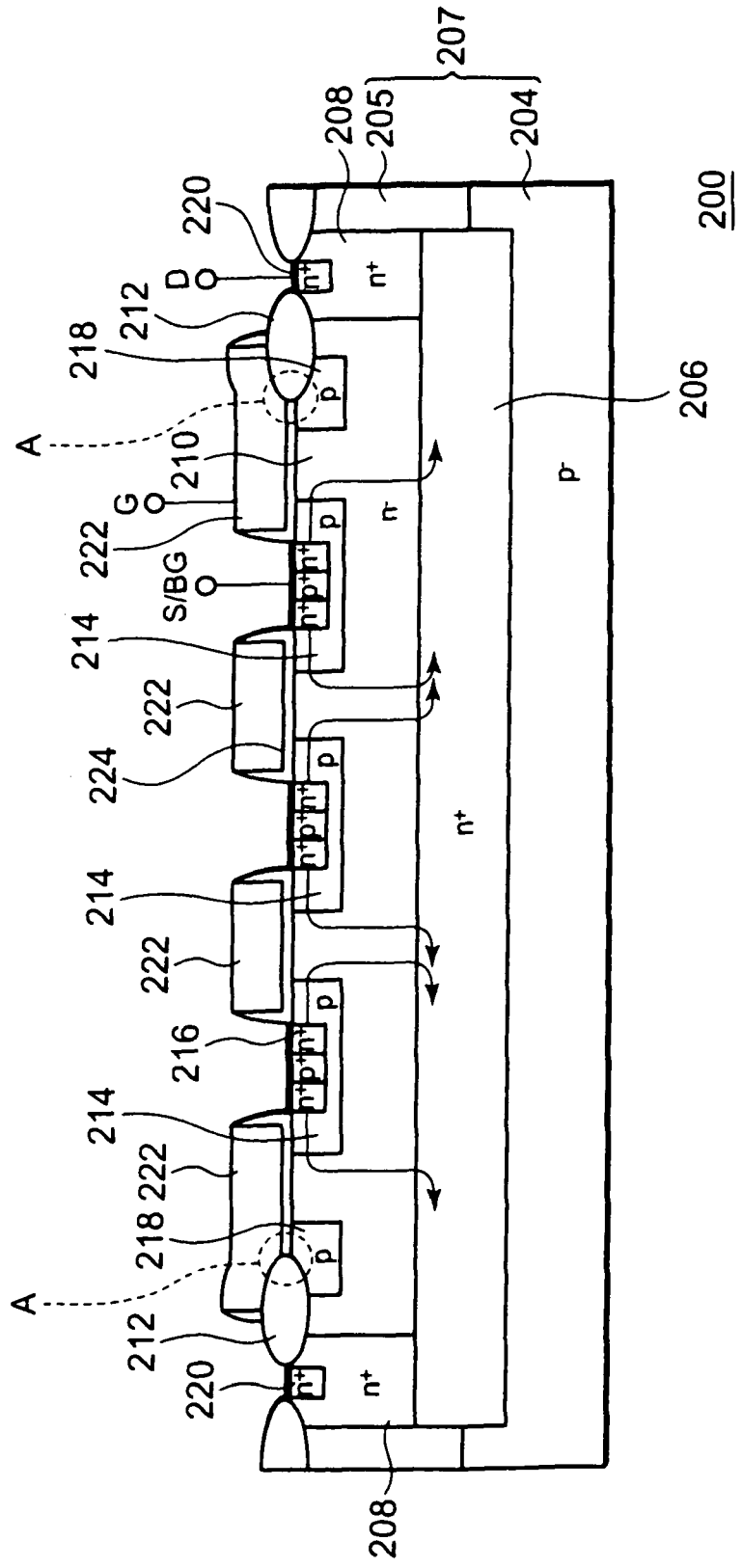
FIG. 8 is a sectional view showing the construction of a traditional semiconductor device.
Figure 9:
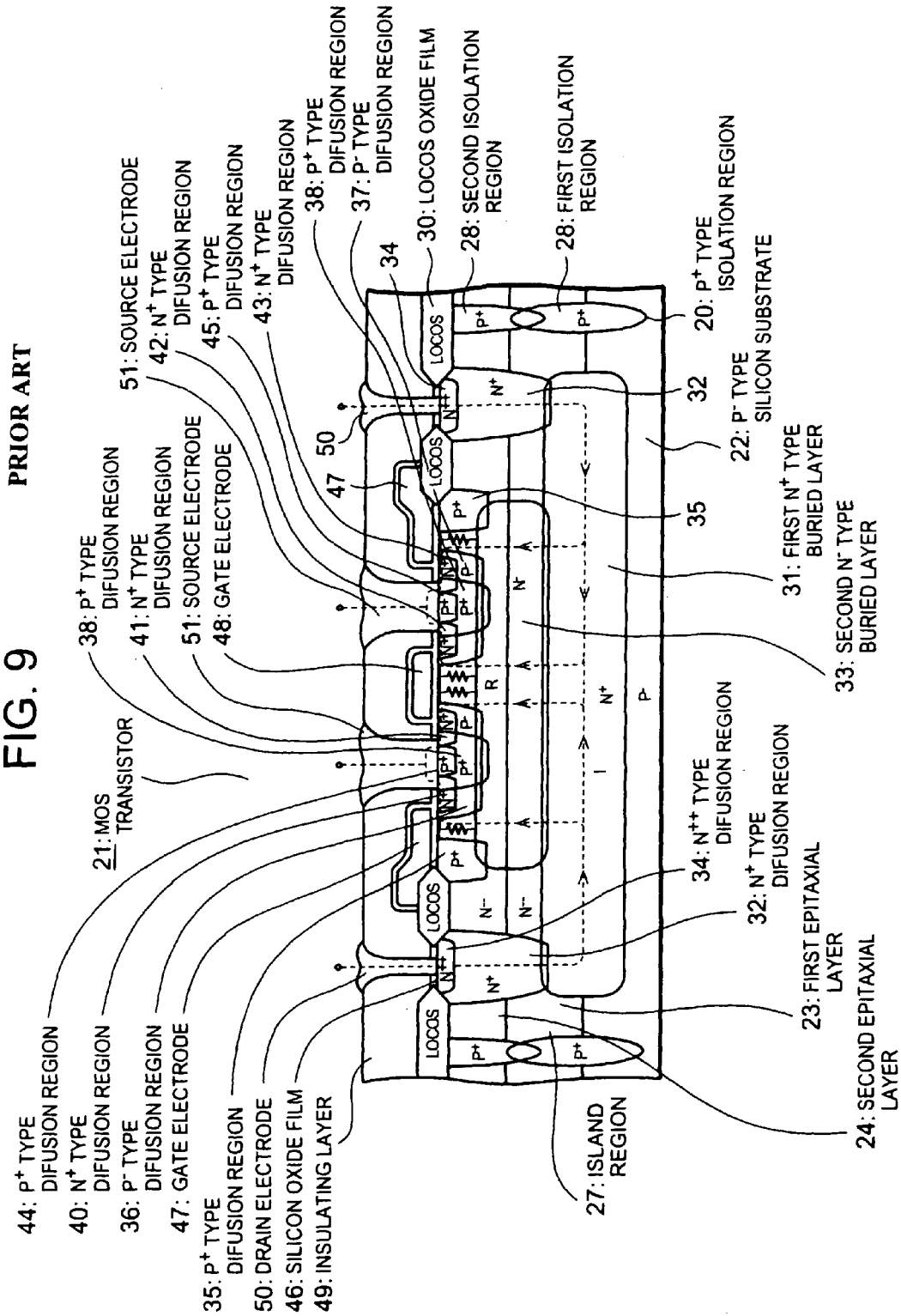
FIG. 9 is a sectional view showing the construction of a traditional semiconductor device.
Figure 10:
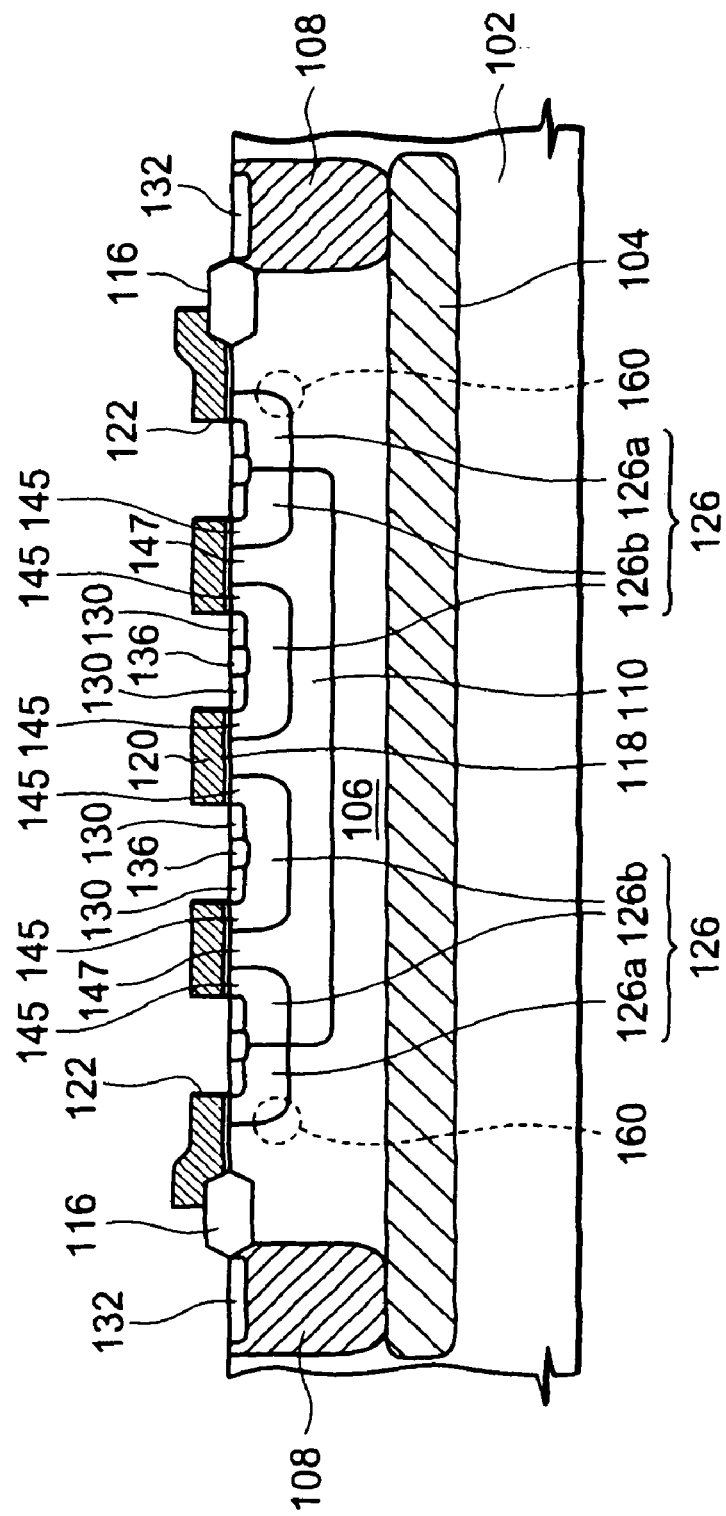
FIG. 10 is a sectional view showing the construction of a traditional semiconductor device.

FIG. 6 is a drawing showing potential distributions in the semiconductor of this embodiment shown in FIG. 1 and the traditional VDMOS transistor shown in FIG. 8. In this drawing, the distribution of impurity ions, the distribution of impact ionization generation rates at breakdown, and potential distribution are shown. FIGS. 7A and 7B are drawings showing in detail the distribution of impact ionization generation rates shown in FIG. 6. FIG. 7A shows the construction of the semiconductor device 300, and FIG. 7B shows the construction of a VDMOS transistor 200.

As seen from the distribution diagram of impurity ions, in the semiconductor device 300, the drift region 310 is formed more deeply than the central portion in a region beneath the isolation insulating film 312. It is understood from the drawing showing the distribution of impact ionization generation rates that, in the VDMOS transistor 200 shown to the right, impact ionization occurs in the inside end of the gate side of the isolation insulation film 212, and breakdown occurs in the location. On the other hand, in the semiconductor 300 shown to the left, impact ionization occurs in the second impurity buried region 332 of the impurity buried layer 306, and breakdown occurs in the location. It is understood from the potential distribution that, in the semiconductor 300 shown to the left, potential is dense in the inside region, and the concentration of the electric field moves inwardly. This embodiment assumes that the drift region 310 of the semiconductor device 300 and the drift region 210 of the VDMOS transistor 200 are equal in concentration. Therefore, the semiconductor device 300 in which the second impurity buried region 332 is formed becomes somewhat lower in breakdown voltage than the VDMOS transistor 200. However, it has been demonstrated that resistivity of 100 V class can be maintained.

Hereinbefore, the present invention has been described based on the preferred embodiments. It will be understood to those skilled in the art that these embodiments are examples, various variants are allowed with combinations of components and processing processes, and the variants are within the scope of the present invention.

Hereinbefore, an example of forming the N-type epitaxial layer 305 on the semiconductor substrate 304 has been shown. However, as another example, the drift region 310 may be formed by forming a P-type epitaxial layer on the semiconductor substrate 304, then injecting N-type impurity ions.

Although the present invention has been described above in connection with several preferred embodiments thereof, it is apparent that the present invention is not limited to above embodiments, but may be modified and changed without departing from the scope and spirit of the invention.

What is claimed is:

1. A semiconductor device including a vertical double-diffused metal-oxide-semiconductor (VDMOS) transistor, said semiconductor device comprising:
    a semiconductor layer;
    a drift region formed at a surface of the semiconductor layer;
    plural body regions formed in the drift region, each of the plural body regions including a source region of a predetermined conductivity type;
    a drain extracting region of the predetermined conductivity type enclosing an outer circumference of the drift region, the drain extracting region having a higher impurity concentration than an impurity concentration of the drift region;
    a separation insulating film formed on the semiconductor layer to enclose the outer circumference of the drift region,
    a gate electrode formed on the semiconductor layer over at least one of the body regions, the gate electrode providing an opening over the source region; and
    a buried layer of the predetermined conductivity type, in the semiconductor layer having a higher impurity concentration than the impurity concentration of the drift region, and comprising a drain region,
    wherein the buried layer includes a first buried region formed below an entire region of the drift region and the drain extracting region, and a second buried region being protruded from the center of the first buried region and spaced apart from the drain extracting region,
    wherein the entire upper surface of the first buried region is planar.

2. The semiconductor device according to claim 1, wherein the first buried region and the second buried region respectively comprise a first impurity and a second impurity, different from the first impurity, as principal components of the predetermined conductivity type, and the second impurity has a faster diffusion speed than a diffusion speed of the first impurity.

3. The semiconductor device according to claim 1, wherein the first buried region and the second buried region respectively comprise a first impurity and a second impurity, different from the first impurity, as principal components of the predetermined conductivity type, and a combination of the first impurity and the second impurity is one of As and P, Sb and P, and Sb and As, in that order.

4. The semiconductor device according to claim 1, wherein the separation insulating film is disposed inside the drift region and the drain extracting region.

5. The semiconductor device according to claim 1, wherein the separation insulating film spaces an uppermost portion of the drift region from an uppermost portion of the drain extracting region.

6. The semiconductor device according to claim 1, wherein, in a plan view, the separation insulating film overlaps the drift region and the drain extracting region.

7. The semiconductor device according to claim 1, wherein the separation insulating film abuts the drift region and the drain extracting region.

8. The semiconductor device according to claim 1, wherein the separation insulating film abuts a boundary of the drift region with the drain extracting region.

9. The semiconductor device according to claim 1, wherein, in a plan view, the separation insulating film is placed outside the second buried region.

10. The semiconductor device according to claim 1, wherein, in a plan view, a part of the drift region spaces apart the separation insulating film from the second buried region.

11. A semiconductor device, comprising:
    a semiconductor layer;
    a drift region formed at a surface of the semiconductor layer;
    plural body regions formed in the drift region, each of the plural body regions including a source region of a predetermined conductivity type;
    a drain extracting region of the predetermined conductivity type enclosing an outer circumference of the drift region;
    a separation insulating film formed on the semiconductor layer to enclose the outer circumference of the drift region;
    a gate electrode formed on the semiconductor layer over at least one of the body regions, the gate electrode providing an opening over the source region; and
    a buried layer of the predetermined conductivity type, in the semiconductor layer, having a higher impurity concentration than an impurity concentration of the drift region, and comprising a drain region,
    wherein the buried layer includes a first buried region formed below an entire region of the drift region and the drain extracting region, and a second buried region being protruded from the center of the first buried region and spaced apart from the drain extracting region;
    wherein the entire upper surface of the first buried region is planar.

12. The semiconductor device according to claim 11, wherein the separation insulating film separates an uppermost region of the drift region from an uppermost region of the drain extracting region in the semiconductor layer.

13. The semiconductor device according to claim 11, wherein the drain extracting region has a higher impurity concentration than an impurity concentration of the drift region.

* * * * *